United States Patent
Ostermaier et al.

(10) Patent No.: US 9,837,520 B2
(45) Date of Patent: Dec. 5, 2017

(54) GROUP III-NITRIDE-BASED ENHANCEMENT MODE TRANSISTOR HAVING A MULTI-HETEROJUNCTION FIN STRUCTURE

(71) Applicant: Infineon Technologies Austria AG, Villach (AT)

(72) Inventors: Clemens Ostermaier, Villach (AT); Gerhard Prechtl, St. Jacob i. Rosental (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/145,855

(22) Filed: May 4, 2016

(65) Prior Publication Data

US 2016/0247905 A1   Aug. 25, 2016

Related U.S. Application Data

(63) Continuation of application No. 14/195,041, filed on Mar. 3, 2014, now Pat. No. 9,337,279.

(51) Int. Cl.
| | |
|---|---|
| *H01L 29/15* | (2006.01) |
| *H01L 29/778* | (2006.01) |
| *H01L 29/06* | (2006.01) |
| *H01L 29/205* | (2006.01) |
| *H01L 29/207* | (2006.01) |
| *H01L 29/40* | (2006.01) |
| *H01L 29/417* | (2006.01) |
| *H01L 29/78* | (2006.01) |
| *H01L 29/10* | (2006.01) |
| *H01L 29/423* | (2006.01) |

(Continued)

(52) U.S. Cl.
CPC ...... *H01L 29/7785* (2013.01); *H01L 29/0619* (2013.01); *H01L 29/0649* (2013.01); *H01L 29/1037* (2013.01); *H01L 29/1054* (2013.01); *H01L 29/1066* (2013.01); *H01L 29/205* (2013.01); *H01L 29/207* (2013.01); *H01L 29/402* (2013.01); *H01L 29/41791* (2013.01); *H01L 29/4236* (2013.01); *H01L 29/7783* (2013.01); *H01L 29/785* (2013.01); *H01L 29/0646* (2013.01); *H01L 29/0843* (2013.01); *H01L 29/2003* (2013.01)

(58) Field of Classification Search
CPC ............. H01L 29/7785; H01L 29/7783; H01L 29/785
USPC .......................................................... 257/76
See application file for complete search history.

(56) References Cited

U.S. PATENT DOCUMENTS

| | | |
|---|---|---|
| 7,271,429 B2 | 9/2007 | Saito et al. |
| 7,728,356 B2 | 6/2010 | Suh et al. |

(Continued)

OTHER PUBLICATIONS

Heikman, Stan et al., "Polarization effects in AlGaN/GaN and GaN/AlGaN/GaN heterostructures", Journal of Applied Physics, Jun. 2003, vol. 93, No. 12, pp. 10114-10118.

(Continued)

*Primary Examiner* — Anthony Ho
(74) *Attorney, Agent, or Firm* — Murphy, Bilak & Homiller, PLLC

(57) ABSTRACT

A Group III-nitride-based enhancement mode transistor includes a multi-heterojunction fin structure. A first side face of the multi-heterojunction fin structure is covered by a first p-type Group III-nitride layer, and a second side face of the multi-heterojunction fin structure is covered by a second p-type Group III-nitride layer.

17 Claims, 5 Drawing Sheets

(51) Int. Cl.
*H01L 29/20* (2006.01)
*H01L 29/08* (2006.01)

(56) References Cited

U.S. PATENT DOCUMENTS

| | | | |
|---|---|---|---|
| 7,732,837 | B2 | 6/2010 | Saito et al. |
| 8,264,032 | B2 | 9/2012 | Yeh et al. |
| 8,338,860 | B2 | 12/2012 | Bhalla et al. |
| 8,420,459 | B1 | 4/2013 | Cheng et al. |
| 8,748,940 | B1 | 6/2014 | Rachmady et al. |
| 8,815,668 | B2 | 8/2014 | Basker et al. |
| 8,895,395 | B1 | 11/2014 | Kerber et al. |
| 8,927,371 | B2 | 1/2015 | Ko et al. |
| 8,927,966 | B2 | 1/2015 | Liu et al. |
| 8,994,035 | B2 | 3/2015 | Simin et al. |
| 9,214,538 | B2 | 12/2015 | Marino et al. |
| 2004/0041169 | A1 | 3/2004 | Ren et al. |
| 2004/0157353 | A1 | 8/2004 | Ouyang et al. |
| 2006/0022262 | A1 | 2/2006 | Yoon et al. |
| 2006/0197129 | A1 | 9/2006 | Wohlmuth |
| 2007/0117355 | A1 | 5/2007 | Ueda et al. |
| 2008/0135886 | A1 | 6/2008 | Irisawa et al. |
| 2008/0237639 | A1 | 10/2008 | Nanjo et al. |
| 2009/0072272 | A1 | 3/2009 | Suh et al. |
| 2009/0251946 | A1 | 10/2009 | Juengling |
| 2010/0207166 | A1 | 8/2010 | Zhu |
| 2010/0258848 | A1 | 10/2010 | Lidow et al. |
| 2010/0320443 | A1 | 12/2010 | Jiang et al. |
| 2011/0049568 | A1 | 3/2011 | Lochtefeld et al. |
| 2011/0210377 | A1 | 9/2011 | Haeberlen et al. |
| 2011/0215378 | A1 | 9/2011 | Hwang et al. |
| 2011/0248283 | A1 | 10/2011 | Cao et al. |
| 2012/0292665 | A1 | 11/2012 | Marino et al. |
| 2012/0305893 | A1 | 12/2012 | Colinge |
| 2012/0313106 | A1 | 12/2012 | He |
| 2013/0015463 | A1 | 1/2013 | Lee |
| 2013/0032860 | A1 | 2/2013 | Marino et al. |
| 2013/0161698 | A1 | 6/2013 | Marino et al. |
| 2013/0187128 | A1 | 7/2013 | Yi et al. |
| 2013/0193446 | A1 | 8/2013 | Chao et al. |
| 2013/0193526 | A1 | 8/2013 | Lo et al. |
| 2013/0207194 | A1 | 8/2013 | Cai et al. |
| 2013/0221366 | A1 | 8/2013 | Curatola et al. |
| 2013/0221409 | A1 | 8/2013 | Nakajima et al. |
| 2013/0334573 | A1 | 12/2013 | Ostermaier et al. |
| 2014/0054546 | A1 | 2/2014 | Liu et al. |
| 2014/0084343 | A1 | 3/2014 | Dewey et al. |
| 2014/0103459 | A1 | 4/2014 | Kinoshita et al. |
| 2014/0120701 | A1 | 5/2014 | Basker et al. |
| 2014/0124791 | A1 | 5/2014 | Curatola et al. |
| 2014/0145246 | A1 | 5/2014 | Ning et al. |
| 2014/0197460 | A1 | 7/2014 | Makiyama |
| 2014/0197889 | A1 | 7/2014 | Makiyama |
| 2014/0264487 | A1 | 9/2014 | Pham et al. |
| 2014/0264488 | A1 | 9/2014 | Fronheiser et al. |
| 2014/0264575 | A1 | 9/2014 | Tsai et al. |
| 2014/0264592 | A1 | 9/2014 | Oxland et al. |
| 2014/0264598 | A1 | 9/2014 | Cheng et al. |
| 2014/0264600 | A1 | 9/2014 | Adam et al. |
| 2014/0284723 | A1 | 9/2014 | Lee et al. |
| 2014/0291760 | A1 | 10/2014 | Cheng et al. |
| 2014/0312396 | A1 | 10/2014 | Ito |
| 2014/0335670 | A1 | 11/2014 | Basker et al. |
| 2014/0374800 | A1 | 12/2014 | Cheng et al. |
| 2015/0034906 | A1 | 2/2015 | Xiao |
| 2015/0249134 | A1 | 9/2015 | Ostermaier et al. |

OTHER PUBLICATIONS

Im, Ki-Sik et al., "Heterojunction-Free GaN Nanochannel FinFETs With High Performance", IEEE Electron Device Letters, Mar. 2013, vol. 34, No, 3, IEEE Electron Devices Society, pp. 381-383.

Im, Ki-Sik et al., "High-Performance GaN-Based Nanochannel FinFETs With/Without AlGaN/GaN Heterostructure", IEEE Transactions on Electron Devices, Oct. 2013, vol. 60, No. 10, IEEE Electron Devices Society, pp. 3012-3018.

Ishida, Hidetoshi et al., "GaN-based Natural Super Junction Diodes with Multi-channel Structures", IEEE international Electron Devices Meeting, Dec. 15-17, 2008, San Francisco, CA, pp. 1-4.

Ishida, Hidetoshi et al., "Unlimited High Breakdown Voltage by Natural Super Junction of Polarized Semiconductor", IEEE Electron Device Letters, Oct. 2008, vol. 29, No. 10, pp. 1087-1089.

Liu, Shenghou et al., "Enhancement-Mode Operation of Nanochannel Array (NCA) AlGaN/GaN HEMTs", IEEE Electron Device Letters, vol. 33, No. 3, Mar. 2012, pp. 354-356.

Lu, Bin et al., "Tri-Gate Normally-Off GaN Power MISFET", IEEE Electron Device Letters, Mar. 2012, vol. 33, No. 3, IEEE Electron Devices Society, pp. 360-362.

Uemoto, Yasuhiro et al., "Gate Injection Transistor (GIT)—A Normally-Off AlGaN/GaN Power Transistor Using Conductivity Modulation", IEEE Transaction of Electron Devices, Dec. 2007, vol. 54, No. 12, pp. 3393-3399.

Uemoto, Yasuhiro et al., "A Normally-off AlGaN/GaN Transistor with RonA=2.6mΩcm² and $BV_{ds}$=640V Using Conductivity Modulation", 2006 International Electron Devices Meeting, Dec. 2006, pp. 1-4.

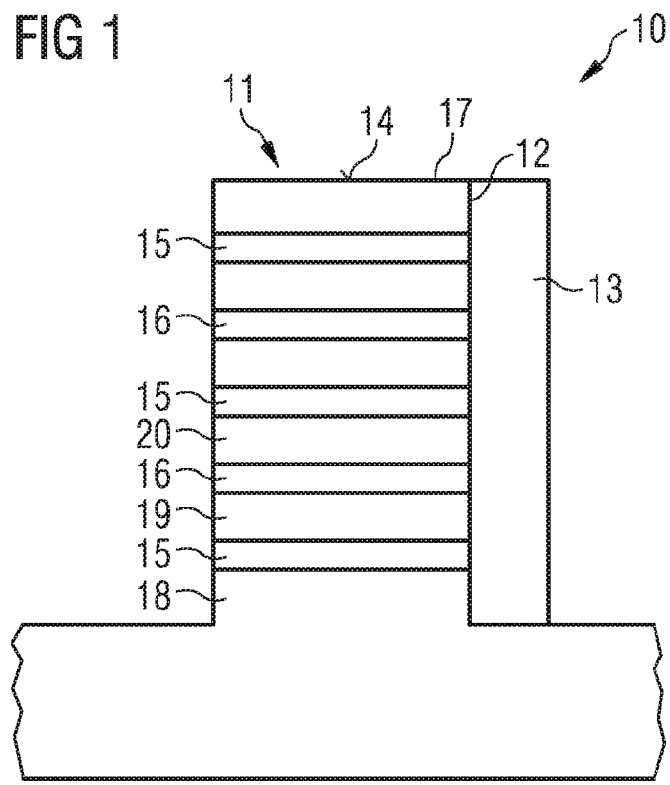
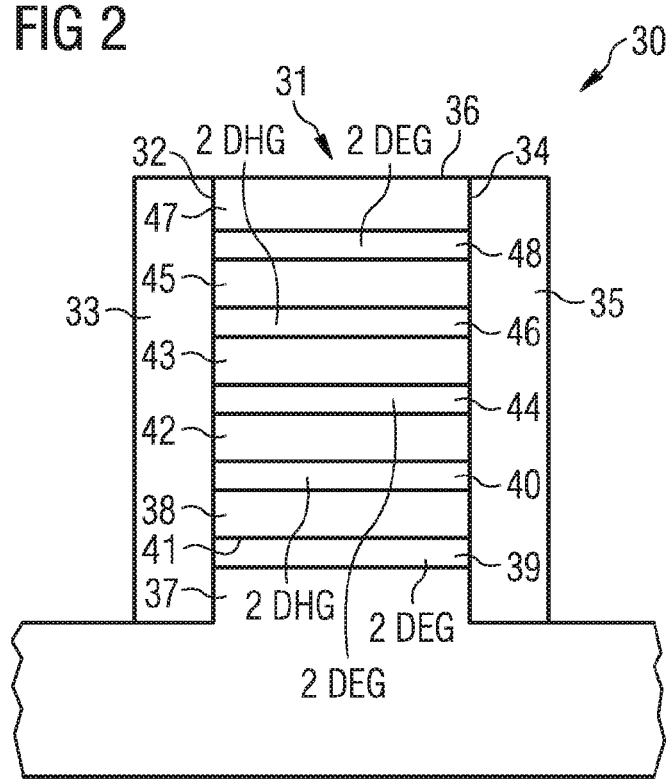

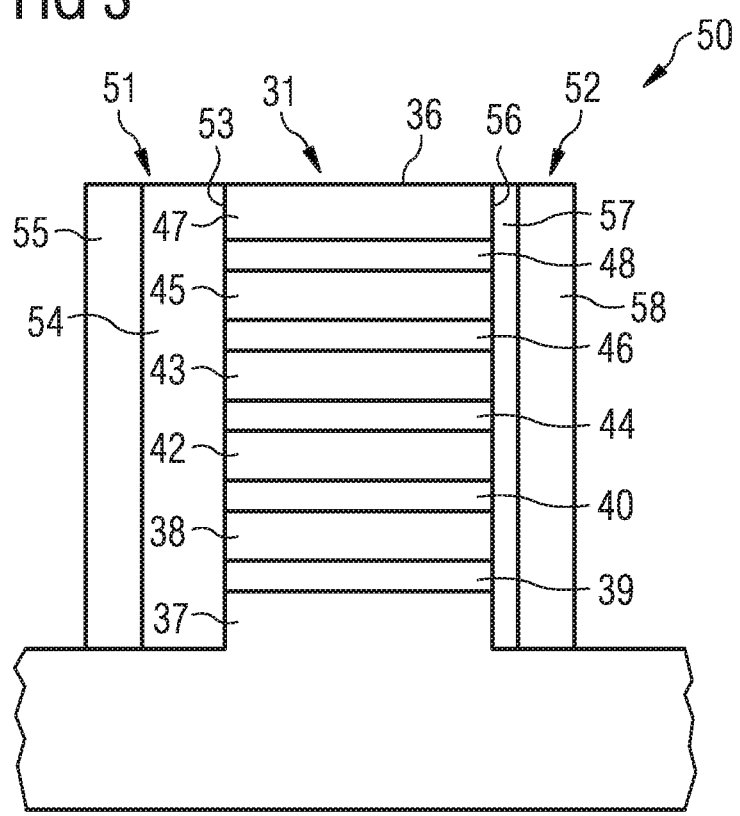

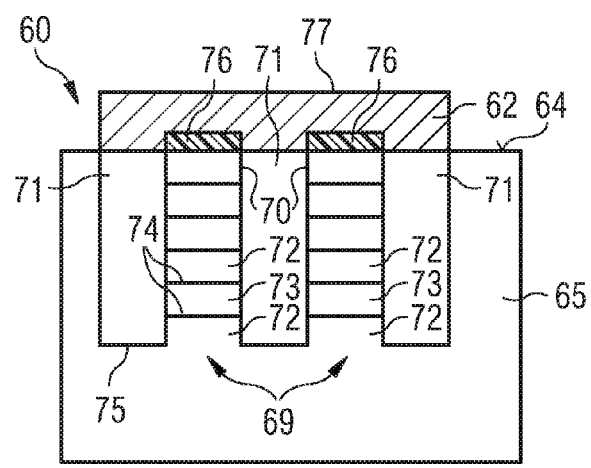
FIG 5  A-A
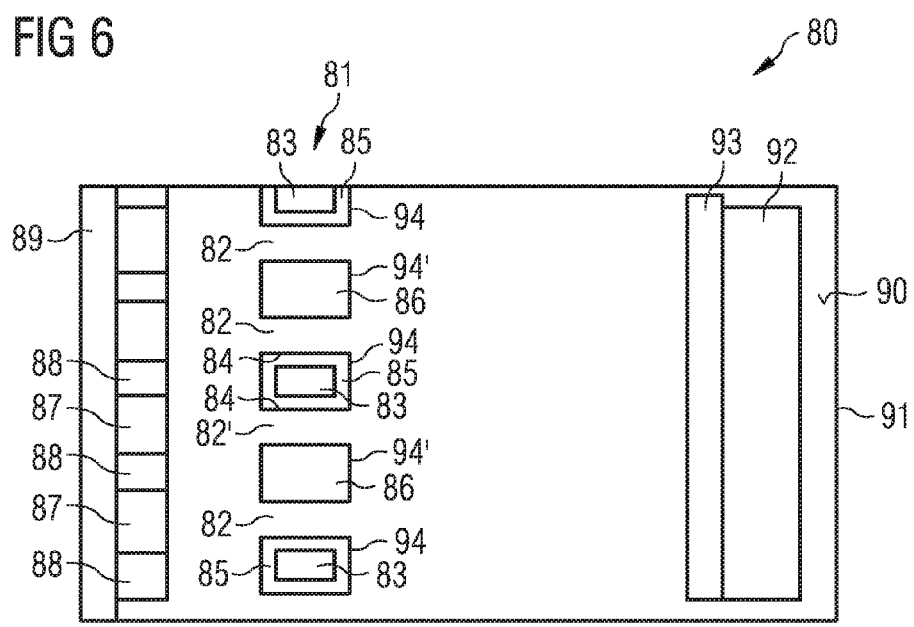
FIG 6

GROUP III-NITRIDE-BASED ENHANCEMENT MODE TRANSISTOR HAVING A MULTI-HETEROJUNCTION FIN STRUCTURE

BACKGROUND

To date, transistors used in power electronic applications have typically been fabricated with silicon (Si) semiconductor materials. Common transistor devices for power applications include Si CoolMOS®, Si Power MOSFETs and Si Insulated Gate Bipolar Transistors (IGBTs). More recently, silicon carbide (SiC) power devices have been considered. Group III-N semiconductor devices, such as gallium nitride (GaN)-based devices, are now emerging as attractive candidates to carry large currents, support high voltages and to provide very low on-resistance and fast switching times.

SUMMARY

In an embodiment, a Group III-nitride-based enhancement mode transistor includes a multi-heterojunction fin structure. A first side face of the multi-heterojunction fin structure is covered by a p-type Group III-nitride layer.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a Group III-nitride-based enhancement mode transistor according to a first embodiment.

FIG. 2 illustrates a schematic cross-sectional view of a Group III-nitride-based enhancement mode transistor according to a second embodiment.

FIG. 3 illustrates a schematic cross-sectional view of a Group III-nitride-based enhancement mode transistor according to a third embodiment.

FIG. 5 illustrates a cross-sectional view along the line A-A indicated in FIG. 4a and FIG. 4b.

FIG. 6 illustrates a schematic top view of a Group III-nitride-based enhancement mode transistor according to a fifth embodiment.

DETAILED DESCRIPTION

Figure 4A:
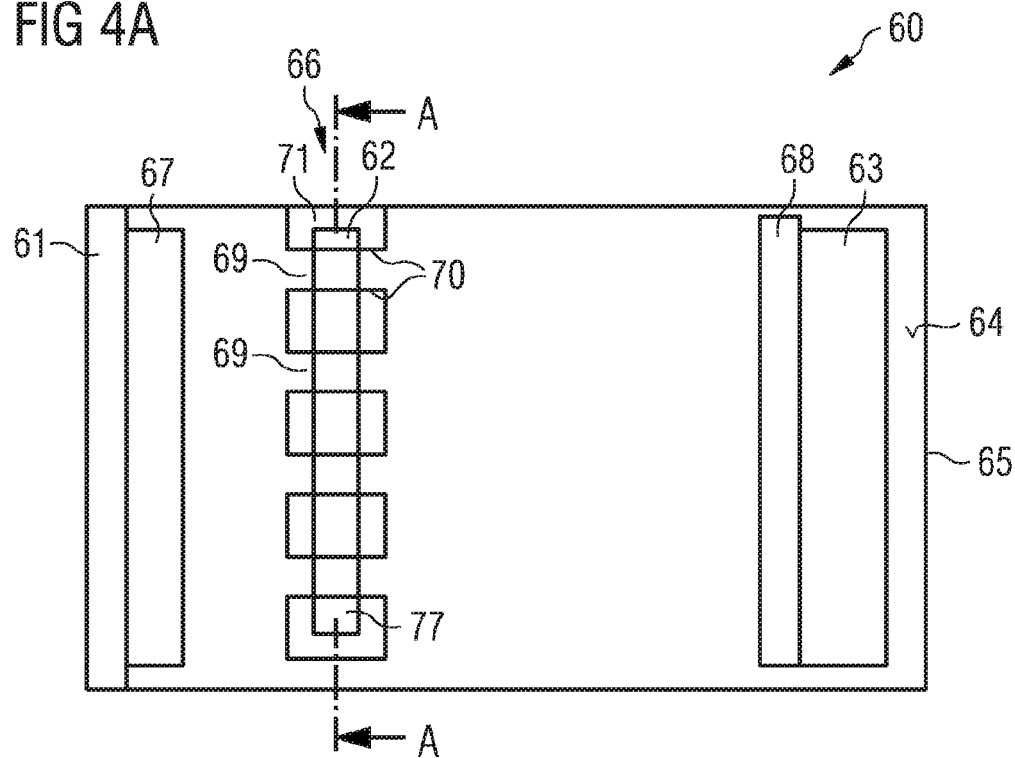
FIG. 4a illustrates a top view of a Group III-nitride-based enhancement mode transistor according to a fourth embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high-voltage depletion-mode transistor, has a negative threshold voltage which means that it can conduct current at zero gate voltage. These devices are normally on. An enhancement-mode device, such as a low-voltage enhancement-mode transistor, has a positive threshold voltage which means that it cannot conduct current at zero gate voltage and is normally off.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), for example. Aluminum gallium nitride refers to an alloy described by the formula $Al_xGa_{(1-x)}N$, where x<1.

FIG. 1 illustrates a Group III-nitride-based enhancement mode transistor 10 including a multi-heterojunction fin structure 11. A first side face 12 of the multi-heterojunction fin structure 11 is covered by a p-type Group III-nitride layer 13.

The p-type Group III-nitride layer 13 may be used to provide a device structure for normally off operation of a Group III-nitride-based transistor including a plurality of heterojunctions which without the p-type Group III-nitride layer 13 would be normally on or a depletion mode transistor. The Group III-nitride-based enhancement mode transistor 10 may be a high electron mobility transistor (HEMT).

The multi-heterojunction fin structure 11, in particular each fin of the multi-heterojunction fin structure 11, may include a multilayer stack 14 configured to provide stacked channels 15, 16 of alternating charge carrier types arranged at intervals along the height of the fin. Each fin includes a plurality of stacked heterojunctions between neighbouring layers of the multi-layer stack. For example, a first channel type 15 may be formed from a two dimensional electron gas (2DEG) and a second channel type 16 may be formed from a two-dimensional hole gas (2DHG). The stacked channels 15, 16 are arranged in an alternating fashion in the multilayer stack 14. Neighbouring layers of an individual fin 17 of the multi-heterojunction fin structure 11 may be configured to provide channels 15, 16 of opposing charge carrier types, i.e. electrons and holes.

For example, the composition of layers 18, 19 may be selected such that the layers 18, 19 have differing bandgaps and/or differing lattice constants, thus creating a negative polarisation at the interface between the layers 18, 19 and supporting a channel 15 including a two-dimensional electron gas. The polarity of the face of one or more of the layers 18, 19 may be adjusted in order to support either a two-dimensional electron gas (2DEG) or a two-dimensional hole gas (2DHG). The thickness of one or both of the layers 18, 19 may also be adjusted to provide a channel supporting either a two dimensional electron gas or two-dimensional hole gas. The fins 17 of the multi-heterojunction fin structure 11 may include alternating layers of gallium nitride (GaN) and aluminium gallium nitride ($Al_xGa_{(1-x)}N$) arranged in a stack providing a stack of heterojunctions.

The Group III-nitride-based enhancement mode transistor 10 may further include a gate electrode arranged on the p-type Group III-nitride layer or a depletion electrode arranged on the p-type Group III-nitride layer. The p-type Group III-nitride layer may be coupled to a separate source or gate electrode or may provide the source or gate electrode. The depletion electrode may be coupled to source.

In an embodiment, the Group III-nitride-based enhancement mode transistor 10 may further include an insulated gate electrode arranged on the second side face of the multi-heterojunction fin structure 11 and a depletion electrode arranged on the p-type Group III-nitride layer on the first side face. The p-type Group III-nitride layer may be arranged on an opposing side face from the insulated gate electrode.

The Group III-nitride-based enhancement mode transistor 10 may include a depletion electrode electrically coupled to the p-type Group III-nitride layer and to channels supporting a second charge carrier type, for example holes of a two dimensional hole gas, and a gate electrode electrically coupled to the channels supporting a first charge carrier type, for example electrons of a two dimensional electron gas.

The Group III-nitride-based enhancement mode transistor 10 may further include a further p-type Group III-nitride layer arranged on a second side face of a further fin of the multi-heterojunction fin structure. A first gate electrode portion may be arranged on the p-type Group III-nitride layer and a second gate electrode portion may be arranged on the further p-type Group III-nitride layer. The first and second gate electrode portions may be electrically coupled to provide a common gate electrode.

The Group III-nitride-based enhancement mode transistor may include a multi-heterojunction fin structure 11 which includes a first Group III-nitride semiconductor layer arranged on the second Group III-nitride semiconductor layer and forming a first heterojunction configured to provide a channel supporting a first charge carrier type. A third Group III-nitride layer is arranged on the second Group III-nitride layer forming a second heterojunction configured to provide a channel supporting a second charge carrier type, the second charge carrier type opposing the first charge carrier type.

For example, the layer 18 may include aluminium gallium nitride, the layer 19 may include gallium nitride and the first channel 15 may include a two dimensional electron gas. A layer 20 may include aluminium gallium nitride and the heterojunction between the layers 19, 20 may provide a channel 16 including a two dimensional hole gas. The multi-heterojunction fin structure 11 is not limited to three layers and may include any number of layers which are configured to producing alternating channels including opposing charge carrier types arranged in a stack.

The multi-heterojunction fin structure 11 may be deposited on a substrate or may include mesa structures in a substrate. In the case of the multi-heterojunction fin structure 11 including mesa structures in a substrate, the p-type Group III-nitride layer, source electrode and gate electrode may be arranged in trenches formed in the substrate and defining the side faces of the mesa structures.

The p-type Group III-nitride layer 13 may be formed by Magnesium doping of a Group III-nitride layer. The Magnesium ions may be introduced by implantation or during growth of the layer. The multi-heterojunction fin structure 11 may include a plurality of fins 17, whereby each fin 17 has a similar structure and a plurality of heterojunctions 15, 16 arranged in a stack.

The Group III-nitride-based enhancement mode transistor 10 may further include a further p-type Group III-nitride layer arranged on at least one side face of a further multi-heterojunction fin structure which is arranged between the first multi-heterojunction fin structure and a drain electrode.

The further p-type Group III-nitride layer may be spaced at a distance from the p-type Group III-nitride layer. This further p-type Group III-nitride layer may be electrically coupled to the source electrode, for example by the metallisation arranged on an upper surface of the Group III-nitride-based enhancement mode transistor 10.

A further p-type Group III-nitride layer may be arranged on a top face of the multi-heterojunction fin structure 11 and may extend over one or two p-type Group III-nitride layers arranged on the first side face and second side face of the multi-heterojunction fin structure.

The multi-heterojunction fin structure may include a plurality of trenches, whereby neighbouring trenches define a fin. For example, the trenches may be arranged in a row and define a plurality of fins, each fin having a height, a length and a width. Each fin includes a stack of heterojunctions.

In embodiments in which the trenches are arranged in a row, a gate electrode or a depletion electrode may be arranged in alternating ones of the trenches. If the trench includes a gate electrode, the trench may be lined with an insulation layer.

In some embodiments in which the trenches are arranged in a row, the type of electrode in the trench may alternate along the length of the row, for example, gate electrode, depletion electrode, gate electrode etc. In these embodiments, each fin is coupled to a gate electrode and to a depletion electrode arranged on opposing side faces of the fin.

FIG. 2 illustrates a schematic cross-sectional view of a Group III-nitride-based enhancement mode transistor 30 including a multi-heterojunction fin structure 31. A first side face 32 of the multi-heterojunction fin structure 31 is covered by a first p-type Group III-nitride layer 33 and a second side face 34 of the multi-heterojunction fin structure 31 is covered by a second p-type Group III-nitride layer 35.

The multi-heterojunction fin structure 31 includes a plurality of fins 36 extending parallel to one another, of which one fin 36 is illustrated in FIG. 2. Each fin 36 includes a multilayer stack in which adjacent layers of the stack include materials of differing composition, differing lattice constants and/or differing band gaps. For example, the fins 36 may include alternating layers of gallium nitride (GaN) 37 and aluminium gallium nitride ($Al_xGa_{(1-x)}N$) 38 which are configured to provide channels 39, 40 including alternating charge carrier types, for example electrons and holes. The p-type Group III-nitride layers 33, 35 may include p-type GaN.

The heterojunction 41 formed between the lowermost gallium nitride layer 37 and lowermost aluminium gallium nitride layer 38 may be configured to provide a channel 39 supporting a two-dimensional electron gas. A second gallium nitride layer 42 is stacked on the lowermost aluminium gallium nitride layer 38 and is configured such that a channel 40 is produced which supports a two-dimensional hole gas. An aluminium gallium nitride layer 43 is stacked on the second gallium nitride layer 42 and is configured to produce a channel 44 supporting a two-dimensional electron gas. A gallium nitride layer 45 is stacked on the aluminium gallium nitride layer 43 and is configured to provide a channel 46 supporting a two-dimensional channel hole gas. An aluminium gallium nitride layer 47 is arranged on the gallium nitride layer 45 and is configured to provide a channel 48 supporting a two-dimensional electron gas.

The p-type Group III-nitride layers 33, 35 may include a p-type gallium nitride layer which makes an ohmic contact to the p-type channels 40, 46. The p-type Group III-nitride layers 33, 35 may form part of a gate electrode or a further gate electrode may be arranged on and/or electrically coupled to the layers p-type Group III-nitride layers 33, 35. The p-type Group III-nitride layers 33, 35 may be used to form a Group III-nitride-based transistor 30 which is normally off.

The p-type Group III-nitride layers 33, 35 may be considered to function as a depletion electrode and, at the same time, a gate electrode.

FIG. 3 illustrates a schematic cross-sectional view of a Group III-nitride-based enhancement mode transistor 50 according to a third embodiment. The Group III-nitride-based enhancement mode transistor 50 includes a multi-heterojunction fin structure 31 having the arrangement described in connection with FIG. 2. The Group III-nitride-based enhancement mode transistor 50 differs in the arrangement of a depletion electrode 51 and a gate electrode 52 with respect to the multi-heterojunction fin structure 31. In this embodiment, the depletion electrode 51 and gate electrode 52 are separate and arranged on opposing side faces of the fin 36.

The multi-heterojunction fin structure 31 includes a first side face 53 which is covered by a p-type Group III-nitride layer 54 in the form of a p-type gallium nitride layer. A depletion electrode 55 is arranged on the p-type Group III-nitride layer 54. The depletion electrode 55 is electrically coupled by an ohmic contact to the p-type Group III-nitride layer 54 and to the p-type channels 40, 46 of the multi-heterojunction fin structure 31. The depletion electrode 55 is coupled to source and, therefore, to source potential.

The gate electrode 52 including a gate dielectric layer 57 is arranged on an opposing second side face 56 of the fin 36. A gate electrode 58 is arranged on the gate dielectric layer 57 which is arranged directly on the opposing second side face 56 of the fin 36.

Figure 4B:
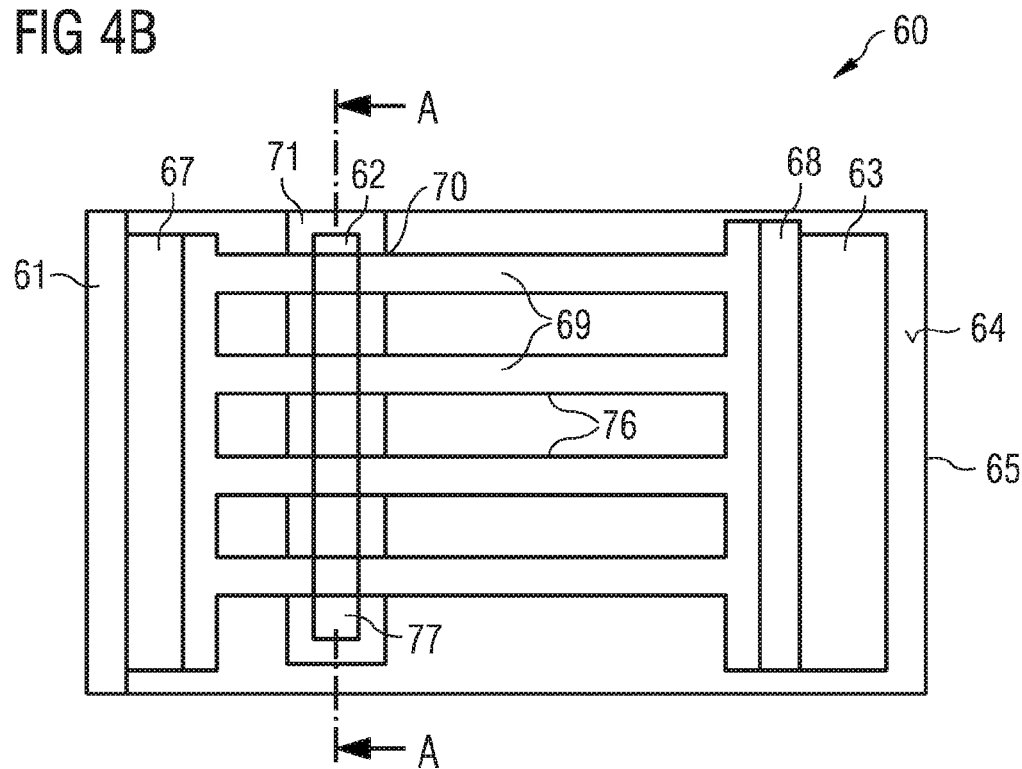
FIG. 4b illustrates a top view of a Group III-nitride-based enhancement mode transistor.

FIG. 4a illustrates a top view of a Group III-nitride-based enhancement mode transistor 60. FIG. 4b illustrates a top view of a Group III-nitride-based enhancement mode transistor 60 with a differing lateral arrangement of the multi-heterojunction fins. FIG. 5 illustrates a cross-sectional view along the line A-A indicated in FIGS. 4a and 4b of the Group III-nitride-based enhancement mode transistor 60.

The Group III-nitride-based enhancement mode transistor 60 includes a source 61, a gate 62 and a drain 63 arranged on an upper surface 64 of a semiconductor body 65 which includes a multi-heterojunction fin structure 66 at least in the region of the semiconductor body 65 arranged underneath the gate 62. The source 61 is electrically coupled to an n-doped region 67 which extends into the semiconductor body 65 and is electrically coupled to the channels of the multi-heterojunction fin structure 66. Similarly, the drain 63 is electrically coupled to an n-doped region 68 which extends into the semiconductor body 65 and which is electrically coupled to the channels provided by the multi-heterojunction fin structure 66. The gate 62 is arranged between the source 61 and the drain 63 on the upper surface 64 of the semiconductor body 65.

The multi-heterojunction fin structure 66 includes a plurality of fins 69. A portion of side faces 70 of the fins 69 are covered by a p-type Group III-nitride layer 71. The p-type Group III-nitride layer 71 may extend between neighbouring fins 69 of the multi-heterojunction fin structure 66. The p-type Group III-nitride layer 71 may include p-type gallium nitride. The fins 69 include a multilayer stack structure including alternating layers of gallium nitride 72 and aluminium gallium nitride 73 which are configured to produce channels including alternating charge carrier types, for example electrons, holes, electrons, holes at the heterojunctions formed between adjacent layers.

The p-type Group III-nitride layers 71 are electrically coupled to channels 74 and provide a depletion function such that the transistor device is normally off. The p-type Group III-nitride layer 71 may be considered to provide a gate electrode which is buried within a trench 75 defining side faces 76 of the neighbouring fins 69. The portions of the p-type Group III-nitride layer 71 arranged in the trenches 75 may be electrically coupled to one another by a conductive structure such as a metallisation structure 77 arranged on the upper surface 64 of the semiconductor body 65. The metallization structure 77 may provide a gate. A passivation layer 76 is arranged on the top face of the fins 69 and electrically insulates the metallization structure 77 from the fins 69, as can be seen in the cross-sectional view of FIG. 5.

The contact between the gate 62 and the p-type layer Group III-nitride layer 71 may be an ohmic contact, a Schottky contact or a MIS (Metal Insulator Semiconductor) contact.

The fins 69 may have differing lengths. In the embodiment illustrated in FIG. 4a, the fins 69 are arranged only in a region under the gate 62 and have a length corresponding to the length of the p-type gallium nitride layer 71. The regions of the semiconductor body 65 outside of the region of the gate 62 have no fins. In a further embodiment, which is illustrated in FIG. 4b, the fins 69 extend from the source 61 arranged adjacent a first side of the semiconductor body 65 to the drain 63 which is arranged adjacent an opposing side of the semiconductor body 65 and have strip-like form.

FIG. 6 illustrates a schematic top view of a Group III-nitride-based enhancement mode transistor 80 including a multichannel multi-heterojunction fin structure 81 including a plurality of fins 82. Each of the fins 82 includes a multilayer stack providing a plurality of heterojunctions, whereby neighbouring heterojunctions of the multilayer stack provide channels including opposite charge carrier types. The charge carrier types of the channels, therefore, alternate in the stack. The composition of the layers, polarity of the face of the layers and/or thickness of one or more of the layers may be configured to provide a channel supporting either a two dimensional electron gas or a two dimensional hole gas.

The Group III-nitride-based enhancement mode transistor 80 includes a gate electrode 83 which is arranged on a side face 84 of each of the fins 82. The gate electrode 83 further includes an insulating layer 85 positioned between the gate electrode 83 and the side face 84. The insulation layer 85 may enclose the gate electrode 83 at all interfaces between the gate electrode 83 and the semiconductor body 91 of the Group III-nitride-based enhancement mode transistor 80. A depletion electrode 86 is arranged on the opposing side face of the fin 82 from that of the gate electrode 83. The depletion electrode 86 is electrically coupled to channels of a first charge carrier type, for example, holes. The depletion electrode 86 extends between neighbouring fins of the multi-heterojunction fin structure 81. A further insulated gate electrode 83 is positioned on the opposing side face 84 of the neighbouring fin 82'. The gate electrodes 83 are electrically coupled to one another and to a gate. Viewed from the top, the gate electrodes 83 alternate with the depletion electrodes 86.

The depletion electrodes 86 may be electrically coupled to the source, for example by p-doped regions 87 which are electrically coupled to a source 89 arranged on an upper surface 90 of the semiconductor body 91. The p-doped regions 87 alternate with n-doped regions 88. The n-doped regions 88 are electrically coupled to the channels of the multi-heterojunction fin structure 81 and to the source 89. A drain 92 is also arranged on the upper surface 90. The drain 92 is electrically coupled to a doped region 93, for example an n-doped region, which is electrically coupled to the channels of the multi-heterojunction fin structure 81.

The fins 82, 82' may be considered to be defined by side walls 84 of trenches 94, 94'. Neighbouring trenches 94, 94' include different electrodes. For example, trench 94 includes a gate electrode 83 and the trenches 94' neighbouring the trench 94 include a depletion electrode 86. Each fin 82, 82' is coupled to a gate electrode 83 and a depletion electrode 86.

Figure 7:
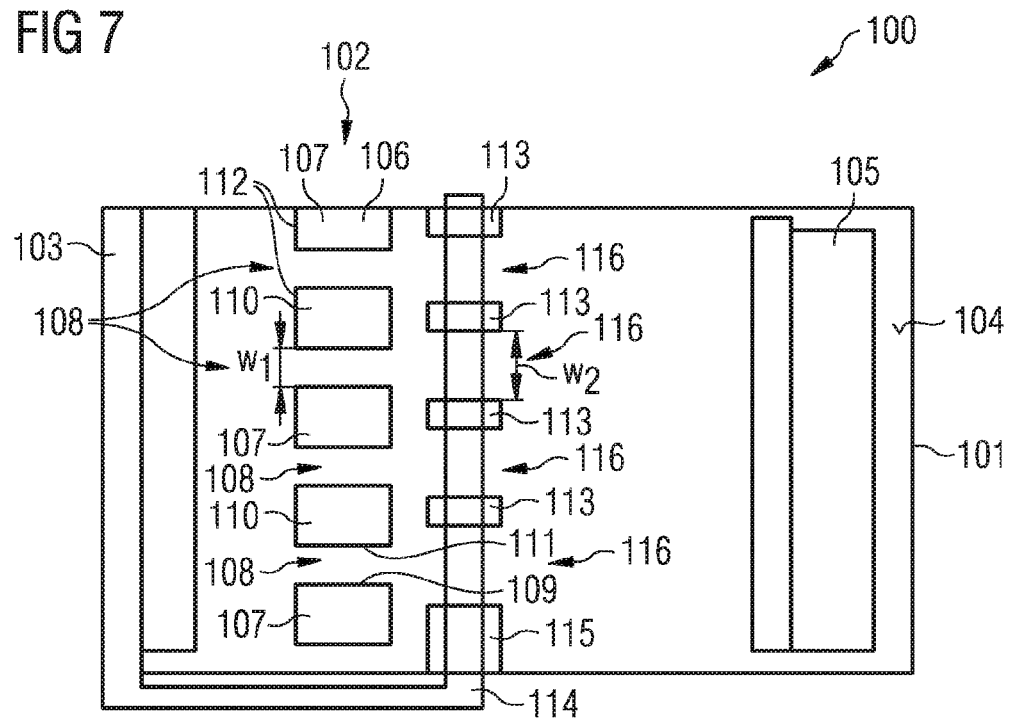
FIG. 7 illustrates a schematic top view of a Group III-nitride-based enhancement mode transistor according to a sixth embodiment.

FIG. 7 illustrates a schematic top view of a Group III-nitride-based enhancement mode transistor 100 according to a sixth embodiment. The Group III-nitride-based enhancement mode transistor 100 includes a semiconductor body 101 including a multi-heterojunction fin structure 102, a source 103 arranged on an upper surface 104 of the semiconductor body 101, a drain 105 spaced at a distance from the source 103 and a gate 106 which is arranged between the source 103 and the drain 105. The drain 105 and the gate 106 are arranged on the upper surface 104 of the semiconductor body 101.

The multi-heterojunction fin structure 102 includes a gate electrode 107 arranged on a side face 109 of each of the fins 108 of the multi-heterojunction fin structure 102 which is electrically coupled to at least one channel extending across the width of the fin 108. The gate electrode 107 is electrically coupled to charge carriers of a first channel or first plurality of channels of the multi-heterojunction fin structure 102.

A p-type Group III-nitride layer 110 is arranged on an opposing side face 111 of each of the fins 108. The p-type Group III-nitride layer 110 provides a depletion electrode which is electrically coupled by an ohmic contact to at least one second channel of the multi-heterojunction fin structure 102 which includes charge carriers of the opposing type to the charge carriers of the first channels that are electrically coupled to the gate electrode 107. The at least one first channel, which is electrically coupled to the gate, may include a two dimensional electron gas and the at least one second channel, which is electrically coupled to the p-type Group III-nitride layer 110, may include a two dimensional hole gas.

The p-type Group III-nitride layer 110 may be inserted to convert a normally-on device or depletion mode transistor into a normally-off device or enhancement mode transistor. The gate electrode 107 and the p-type gallium nitride layer 110 may be considered as covering at least the side faces of trenches 112 formed between neighbouring fins 108 of the multi-heterojunction fin structure 102.

The Group III-nitride-based enhancement mode transistor 100 further includes a second plurality of p-type Group III-nitride layers 113 spaced at a distance from the gate electrode 107 and the first p-type Group III-nitride layers 109 such that the second plurality of p-type Group III-nitride layers are arranged between the gate electrodes 107 and the drain 105 and between first p-type Group III-nitride layers 109 and the drain 105.

The second plurality of p-type Group III-nitride layers 113 can be considered to fill a second plurality of trenches 115 spaced at a distance from the trenches 112 in which the gate electrodes 107 and the first plurality of p-type Group III-nitride layers 109 are arranged. The neighbouring ones of the second plurality of trenches 115 are separated from one another by a second fin 116. The second fins and second plurality of trenches 115 may be considered to provide a second multi-heterojunction structure which is spaced at a distance from the first multi-heterojunction structure 102 in the direction of the drain.

Each second fin 116 may be arranged adjacent a fin 108 of the multi-heterojunction fin structure 102 and each trench 115 may be arranged adjacent a trench 112 of the multi-heterojunction fin structure 102 in the upper surface 104 of the semiconductor body 101.

Each of the second fins 116 may have a width $w_2$ sufficient to ensure that the Group III-nitride-based enhancement mode transistor 100 is an enhancement mode device and is, therefore, normally off. The width $w2$ of the second fins 116 may be sufficiently large such that the second plurality of p-type Group III nitride layers 113 does not result in a depletion of the charge carriers of the channels formed by the heterojunctions. The width $w_2$ of the second fins 116 may be larger than the width $w_1$ of the fins 108 of the multi-heterojunction fin structure 102.

The portions of the second plurality of p-type Group III-nitride layers 113 are electrically coupled to one another by a metallisation structure 114 which is electrically coupled to the source 103. The metallization 114 may be electrically coupled to some or all of the channels supporting a two-dimensional hole gas and may be arranged such that holes may be removed inserted at the onset of the drift region of the device.

Figure 8:
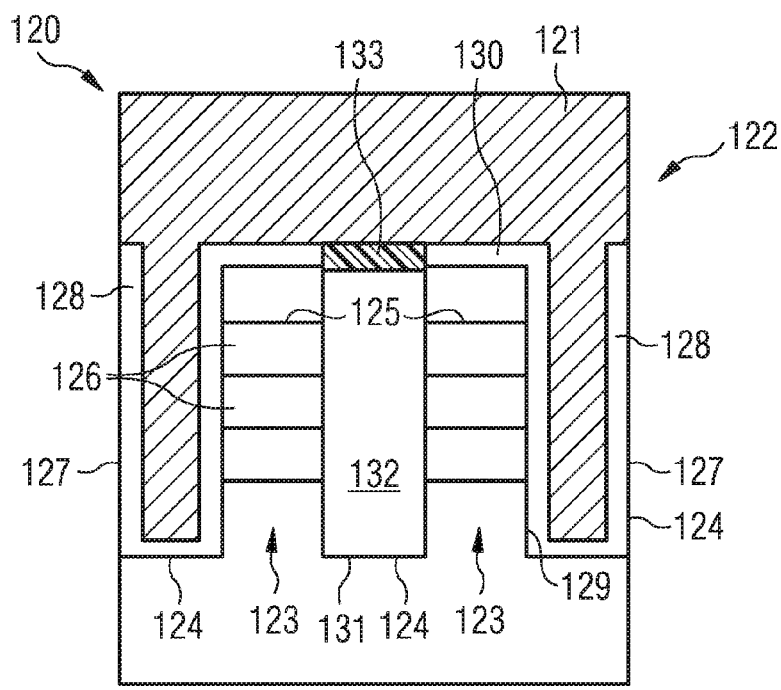
FIG. 8 illustrates a cross-sectional view of a portion of a Group III-nitride-based enhancement mode transistor according to a seventh embodiment.

FIG. 8 illustrates a cross-sectional view of a portion of a Group III-nitride-based enhancement mode transistor 120 according to a seventh embodiment.

The cross-sectional view is taken along the length of a gate 121 which covers a multi-heterojunction fin structure 122. The heterojunction fin structure 122 includes a plurality of fins 123 defined by trenches 124.

Each of the fins 123 includes a plurality of heterojunctions 125 arranged in a stack. The heterojunctions 125 are formed between contiguous layers 126 including differing Group III-nitride compounds, such as aluminium gallium nitride and gallium nitride.

Alternate ones 127 of the trenches 124 are lined with the p-type Group III nitride layer 128 such that a side face 129 and a top face 130 of each fin 123 are covered by the p-type Group III-nitride layer 128. The p-type Group III-nitride layer 128 may include p-type gallium nitride, for example. In this embodiment, the p-type Group III-nitride layer 128 does not fill the trenches 127. The gate 121 is positioned directly on the upper surface of the p-type gallium nitride layer 128 and extends into the trenches 127 and extends between portions of the Group III-nitride layer 128 positioned on opposing walls of the trenches 124. The gate 121 is electrically coupled to the p-type Group III-nitride layer 128.

Trenches 131 are positioned between the trenches 127 including the gate and are filled with a second p-type Group III-nitride layer 132. The second p-type Group III-nitride layer 132 is coupled to a source which is not illustrated in the cross-sectional view of FIG. 8. An insulation layer 133 is arranged in the upper portion of the trenches 131 to insulate the second p-type Group III-nitride layer 132 from the overlying metal of the gate 121.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A Group III-nitride-based enhancement mode transistor, comprising a multi-heterojunction fin structure comprising a multi-layer stack configured to provide channels of alternating conductivity types, wherein a first side face of the multi-heterojunction fin structure is covered by a first p-type Group III-nitride layer and a second side face of the multi-heterojunction fin structure is covered by a second p-type Group III-nitride layer.

2. The Group III-nitride-based enhancement mode transistor of claim 1, wherein adjacent layers of a fin of the multi-heterojunction fin structure comprise at least one of the group consisting of differing compositions, differing bandgaps and differing lattice constants.

3. The Group III-nitride-based enhancement mode transistor of claim 1, wherein a fin of the multi-heterojunction fin structure comprises alternating layers of GaN and $Al_xGa_{(1-x)}N$ configured to provide channels of alternately charge carrier types.

4. The Group III-nitride-based enhancement mode transistor of claim 1, wherein the first p-type Group III-nitride layer and the second p-type Group III-nitride layer comprise p-type GaN.

5. The Group III-nitride-based enhancement mode transistor of claim 4, wherein the p-type GaN layer forms an ohmic contact to channels supporting a two dimensional hole gas.

6. The Group III-nitride-based enhancement mode transistor of claim 1, wherein the first p-type Group III-nitride layer and the second p-type Group III-nitride layer form part of a gate electrode.

7. The Group III-nitride-based enhancement mode transistor of claim 1, further comprising a further gate electrode arranged on and electrically coupled to the first p-type Group III-nitride layer and the second p-type Group III-nitride layer.

8. The Group III-nitride-based enhancement mode transistor of claim 1, wherein the first p-type Group III-nitride layer and the second p-type Group III-nitride layer function as a depletion electrode and a gate electrode.

9. The Group III-nitride-based enhancement mode transistor of claim 1, wherein the multi-heterojunction fin structure comprises a plurality of fins extending parallel to one another.

10. The Group III-nitride-based enhancement mode transistor of claim 1, wherein the multi-heterojunction fin structure is deposited on a substrate.

11. The Group III-nitride-based enhancement mode transistor of claim 1, wherein the multi-heterojunction fin structure comprises mesa structures in a substrate.

12. The Group III-nitride-based enhancement mode transistor of claim 1, wherein the p-type Group III-nitride layer is formed by Magnesium doping.

13. The Group III-nitride-based enhancement mode transistor of claim 1, wherein the multi-heterojunction fin structure comprises a plurality of fins.

14. The Group III-nitride-based enhancement mode transistor of claim 1, wherein the Group III-nitride-based enhancement mode transistor comprises a High Electron Mobility Transistor.

15. A Group III-nitride-based enhancement mode transistor, comprising a multi-heterojunction fin structure, wherein a first side face of the multi-heterojunction fin structure is covered by a first p-type Group III-nitride layer and a second side face of the multi-heterojunction fin structure is covered by a second p-type Group III-nitride layer, wherein neighbouring heterojunctions of a fin of the multi-heterojunction fin structure are configured to provide channels supporting opposing charge carrier types.

16. A Group III-nitride-based enhancement mode transistor, comprising a multi-heterojunction fin structure, wherein a first side face of the multi-heterojunction fin structure is covered by a first p-type Group III-nitride layer and a second side face of the multi-heterojunction fin structure is covered by a second p-type Group III-nitride layer, wherein the multi-heterojunction fin structure further comprises a first Group III-nitride semiconductor layer arranged on a second Group III-nitride semiconductor layer forming a first heterojunction configured to provide a channel of a first conductivity type, and a third Group III-nitride layer arranged on the second Group III-nitride semiconductor layer forming a second heterojunction configured to provide a channel of a second conductivity type, the second conductivity type opposing the first conductivity type.

17. The Group III-nitride-based enhancement mode transistor of claim 16, wherein each of the first heterojunction and the second heterojunction extends from the first side face of the multi-heterojunction fin structure to the second side face of the multi-heterojunction fin structure.

\* \* \* \* \*